(12) United States Patent
Terasaki et al.

(10) Patent No.: US 9,059,229 B2
(45) Date of Patent: Jun. 16, 2015

(54) SUBSTRATE PROCESSING APPARATUS AND METHOD OF MANUFACTURING SEMICONDUCTOR DEVICE

(71) Applicant: Hitachi Kokusai Electric Inc., Tokyo (JP)

(72) Inventors: Tadashi Terasaki, Toyama (JP); Masanori Nakayama, Toyama (JP); Mitsunori Takeshita, Toyama (JP); Katsunori Funaki, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/024,249

(22) Filed: Sep. 11, 2013

(65) Prior Publication Data

US 2014/0106573 A1    Apr. 17, 2014

(30) Foreign Application Priority Data

Sep. 12, 2012    (JP) ................................. 2012-200560
Sep. 10, 2013    (JP) ................................. 2013-186834

(51) Int. Cl.
| H01L 21/316 | (2006.01) |
|---|---|
| H01L 21/687 | (2006.01) |
| H01L 21/67 | (2006.01) |
| H01J 37/32 | (2006.01) |
| H01L 21/02 | (2006.01) |
| H01L 21/321 | (2006.01) |

(52) U.S. Cl.
CPC .... *H01L 21/68785* (2013.01); *H01L 21/31654* (2013.01); *H01L 21/67017* (2013.01); *H01J 37/321* (2013.01); *H01J 37/3211* (2013.01); *H01L 21/68742* (2013.01); *H01L 21/02164* (2013.01); *H01L 21/02238* (2013.01); *H01L 21/02252* (2013.01); *H01L 21/32105* (2013.01)

(58) Field of Classification Search
CPC ..................... H01L 21/6785; H01L 21/31654; H01L 21/67017
USPC ........................................ 438/771; 118/723 R
See application file for complete search history.

(56) References Cited

U.S. PATENT DOCUMENTS

| 5,766,379 | A * | 6/1998 | Lanford et al. ................ 148/537 |
|---|---|---|---|
| 2001/0054605 | A1* | 12/2001 | Suzuki et al. ............. 219/121.43 |
| 2010/0319619 | A1* | 12/2010 | Fujita et al. .................... 118/697 |
| 2011/0250763 | A1* | 10/2011 | Takahashi et al. ............. 438/771 |
| 2011/0256726 | A1* | 10/2011 | LaVoie et al. .................. 438/702 |
| 2012/0298039 | A1* | 11/2012 | Peuse et al. ................. 118/723.1 |
| 2013/0267098 | A1* | 10/2013 | Maeda et al. .................. 438/710 |

* cited by examiner

*Primary Examiner* — Christine Enad
(74) *Attorney, Agent, or Firm* — Edell, Shapiro & Finnan LLC (57) ABSTRACT

A substrate processing apparatus includes a substrate processing chamber including a plasma generation space where a plasma is generated and a substrate processing space where a substrate is placed during a substrate process; an inductive coupling structure outside the plasma generation space wherein a sum of electrical lengths of a coil of the inductive coupling structure and a waveform adjustment circuit connected to the coil is an integer multiple of a wavelength of an applied power; a substrate mounting table in the substrate processing space and supporting the substrate including grooves having high aspect ratios with a silicon-containing layer disposed thereon; a substrate transfer port at a wall of the substrate processing chamber; a substrate mounting table elevator moving the substrate mounting table upward/downward; an oxygen gas supply system to supply an oxygen-containing gas into the plasma generation space; and an exhaust unit exhausting gas from the substrate processing chamber.

7 Claims, 7 Drawing Sheets

SUBSTRATE PROCESSING APPARATUS AND METHOD OF MANUFACTURING SEMICONDUCTOR DEVICE

FIELD OF THE INVENTION

The present invention relates to a substrate processing apparatus and a method of manufacturing a semiconductor device.

BACKGROUND

Recently, as semiconductor devices such as flash memories have become finer, pattern sizes have become remarkably finer. Thus, in order to form such a fine pattern, a predetermined treatment such as oxidization or nitridation may be performed on a substrate as a process included in a manufacturing process.

A process of forming grooves between circuits and forming a linear film or a wire in the grooves is one of methods of forming such a fine pattern. The grooves are formed to have a high aspect ratio as pattern sizes have recently become finer.

In order to form the liner film or the like, it is required to form a film having high step coverage, which has a uniform thickness, on upper, middle, and lower side surfaces of and the bottoms of the grooves. When a film having high step coverage is formed, a semiconductor device may have uniform characteristics between the grooves, thereby suppressing a variation in the characteristics of the semiconductor device.

Although there have been many attempts to process grooves having a high aspect ratio by heating a gas or using a gas in a plasma state, it is difficult to form a film having high step coverage.

SUMMARY

Thus, it is an object of the present invention to provide a substrate processing apparatus and a method of manufacturing a semiconductor device which are capable of forming a film having high step coverage even in grooves having a high aspect ratio.

According to one aspect of the present invention, there is provided substrate processing apparatus including a substrate processing chamber including a plasma generation space where a plasma is generated and a substrate processing space where a substrate is placed during a substrate process, the substrate processing space communicating with the plasma generation space; an inductive coupling structure disposed outside the plasma generation space wherein a sum of electrical lengths of a coil of the inductive coupling structure and a waveform adjustment circuit connected to the coil is an integer multiple of a wavelength of an applied power; a substrate mounting table disposed in the substrate processing space and supporting the substrate including grooves having high aspect ratios with a silicon-containing layer being disposed thereon; a substrate transfer port disposed at a wall of the substrate processing chamber; a gas supply unit including an oxygen gas supply system configured to supply an oxygen-containing gas into the plasma generation space; and an exhaust unit configured to exhaust a gas from the substrate processing chamber.

According to another aspect of the present invention, there is provided a method of manufacturing a semiconductor device, comprising: placing a substrate on a substrate mounting table disposed in a substrate processing chamber via a substrate transfer port, the substrate including grooves having high aspect ratios with a silicon-containing layer being disposed thereon; exhausting a gas while supplying an oxygen gas into a plasma generation space at an upper portion of the substrate processing chamber, the plasma generation space communicating with a space; generating a plasma in the plasma generation space by applying an electric power to a coil of an inductive coupling structure disposed at a peripheral portion of the plasma generation space, the electric power having a wavelength equal to an integer multiple of a sum of electrical lengths of the coil and a waveform adjustment circuit connected to the coil such that a generated plasma potential is lower than or equal to an electric potential of the substrate; and oxidizing the substrate in the substrate processing chamber using the plasma.

According to the present invention, a substrate processing apparatus and a method of manufacturing a semiconductor device which are capable of forming a film having high step coverage even in grooves having a high aspect ratio are provided.

Figure 1:
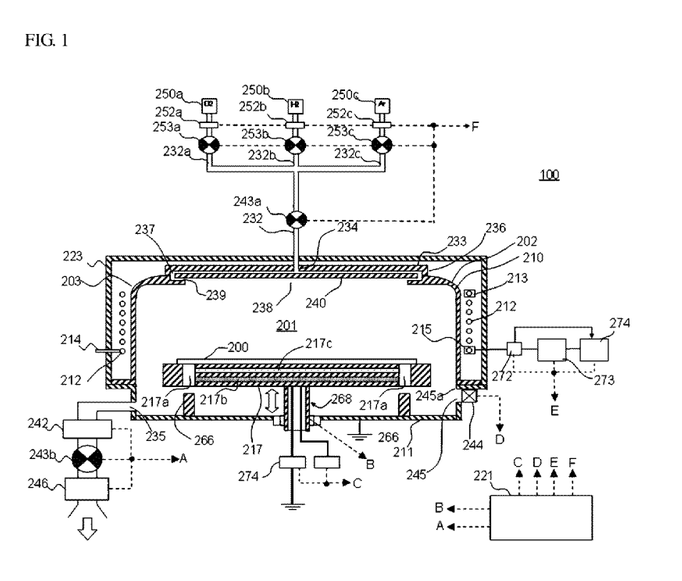
FIG. 1 a cross-sectional view of a substrate processing apparatus according to an exemplary embodiment of the present invention.

FIRST EMBODIMENT OF THE PRESENT INVENTION (1) Structure of Substrate Processing Apparatus A substrate processing apparatus according to a first embodiment of the present invention will be described below with reference to FIGS. 1 to 5. FIG. 1 is a cross-sectional view of a substrate processing apparatus according to an exemplary embodiment of the present invention.

(Process Chamber)

The substrate processing apparatus 100 includes a process furnace 202 configured to plasma-process wafers 200. In the process furnace 202, a process container 203 that constitutes a process chamber 201 is installed. The process container 203 includes a dome-shaped upper container 210 which is a first container, and a lower container 211 which is a second container. The process chamber 201 is formed by covering an upper surface of the lower container 211 with the upper container 210. For example, the upper container 210 is formed of a non-metal material such as aluminum oxide ($Al_2O_3$) or quartz ($SiO_2$), and the lower container 211 is formed of aluminum (Al).

A gate valve 244 is installed on a lower sidewall of the lower container 211. The wafers 200 may be loaded into the process chamber 201 via a loading port 245 using a transfer mechanism (not shown) when the gate valve 244 is open. Otherwise, the gate valve 244 may be configured to unload the wafers 200 from the process chamber 201 via the loading port 245 using the transfer mechanism. The gate valve 244 is configured to continuously air-tightly close the inside of the process chamber 201 when the gate valve 244 is closed.

The process chamber 201 includes a plasma generation space 201a around which a coil 212 is installed, and a substrate processing space 201b in which the wafers 200 are processed in communication with the plasma generation space 201a as described below. The plasma generation space 201a is a space where plasma is generated, and is located in the process chamber 201 above a lower part of the resonance coil 212 (indicated by a dotted and dashed line). The substrate processing space 201b is a space where a substrate is processed with plasma, and is located below the lower part of the resonance coil 212.

(Susceptor)

A susceptor 217 serving as a substrate mounting table on which the wafers 200 are placed is disposed on a lower central portion of the process chamber 201. The susceptor 217 is formed of a non-metal material, e.g., aluminum nitride (AlN), ceramics, or quartz, and is configured to reduce metallic pollution of a film or the like to be formed on the wafers 200.

In the susceptor 217, a heater 217b serving as a heating mechanism is integrally embedded. The heater 217b is configured to heat surfaces of the wafers 200, for example, to about 25 to 700° C., when power is supplied to the heater 217b.

The susceptor 217 is electrically insulated from the lower container 211. An impedance adjustment electrode 217c is installed in the susceptor 217. The impedance adjustment electrode 217c is grounded via an impedance varying mechanism 275 serving as an impedance adjustor. The impedance varying mechanism 275 includes a coil or a variable capacitor, and is configured to change impedance within a range of a parasitic impedance value of the process chamber 201 starting from about 0Ω by controlling an inductance and resistance of the coil or a capacitance value of the variable capacitor. Thus, electric potentials (bias voltages) of the wafers 200 may be controlled via the impedance adjustment electrode 217c and the susceptor 217.

At the susceptor 217, a susceptor elevating mechanism 268 is installed to move the susceptor 217 upward/downward. Also, through-holes 217a are formed in the susceptor 217 and wafer elevating pins 266 are installed at a surface of the lower container 211. At least three through-holes 217a and at least three wafer elevating pins 266 are installed at opposite locations. The wafer elevating pins 266 are configured to pass through the through-holes 217a not in contact with the susceptor 217 when the susceptor 217 is moved downward by the susceptor elevating mechanism 268.

The substrate mounting table according to the present embodiment mainly includes the susceptor 217, the heater 217b, and the electrode 217c.

(Gas Supply Unit)

A shower head 236 is installed above the process chamber 201, i.e., on the upper container 210. The shower head 236 includes a cap-shaped lid 233, a gas introduction port 234, a buffer chamber 237, an opening 238, a shielding plate 240, and a gas outlet 239, and is configured to supply a reactive gas into the process chamber 201. The buffer chamber 237 functions as a dispersion space for dispersing a reactive gas introduced from the gas introduction port 234.

At the gas introduction port 234, a downstream side of an oxygen-containing gas supply pipe 232a configured to supply oxygen ($O_2$) gas as an oxygen-containing gas, a downstream side of a hydrogen-containing gas supply pipe 232b configured to supply hydrogen ($H_2$) gas as a hydrogen-containing gas, and an inert gas supply pipe 232c configured to supply argon (Ar) gas as an inert gas are connected to join together. At the oxygen-containing gas supply pipe 232a, an $O_2$ gas supply source 250a, a mass flow controller 252a serving as a flow rate control device, and a valve 253a serving as an opening/closing valve are sequentially installed starting from an upstream side. At the hydrogen-containing gas supply pipe 232b, a $H_2$ gas supply source 250b, a mass flow controller 252b serving as a flow rate control device, and a valve 253b serving as an opening/closing valve are sequentially installed starting from an upstream side. At the inert gas supply pipe 232c, an Ar gas supply source 250c, a mass flow controller 252c serving as a flow rate control device, and a valve 253c serving as an opening/closing valve are sequentially installed starting from an upstream side. A valve 243a is installed at a downstream side at which the oxygen-containing gas supply pipe 232a, the hydrogen-containing gas supply pipe 232b, and the inert gas supply pipe 232c join, and is connected to the upstream side of the gas introduction port 234. Reactive gases such as an oxygen-containing gas, a hydrogen-containing gas, and an inert gas may be supplied into the process chamber 201 via the gas supply pipes 232a, 232b, and 232c while the flow rates of the gases are controlled by the mass flow controllers 252a, 252b, and 252c by opening/closing the valves 253a, 253b, 253c, and 243a.

The gas supply unit according to the present embodiment mainly includes the shower head 236 (including the lid 233, the gas introduction port 234, the buffer chamber 237, the opening 238, the shielding plate 240, and the gas outlet 239), the oxygen-containing gas supply pipe 232a, the hydrogen-containing gas supply pipe 232b, the inert gas supply pipe 232c, the mass flow controllers 252a, 252b, and 252c, and the valves 253a, 253b, 253c, and 243a.

An oxygen-containing gas supply system according to the present embodiment mainly includes the shower head 236 (including the lid 233, the gas introduction port 234, the buffer chamber 237, the opening 238, the shielding plate 240, and the gas outlet 239), the oxygen-containing gas supply pipe 232a, the mass flow controller 252a, and the valves 253a and 243a.

A hydrogen gas supply system according to the present embodiment mainly includes the shower head 236 (including the lid 233, the gas introduction port 234, the buffer chamber 237, the opening 238, the shielding plate 240, and the gas outlet 239), the hydrogen-containing gas supply pipe 232b, the mass flow controller 252b, and the valves 253b and 243a.

An inert gas supply system according to the present embodiment mainly includes the shower head 236 (including the lid 233, the gas introduction port 234, the buffer chamber 237, the opening 238, the shielding plate 240, and the gas outlet 239), the inert gas supply pipe 232c, the mass flow controller 252c, and the valves 253c and 243a.

The O$_2$ gas supply source 250a, the H$_2$ gas supply source 250b, and the Ar gas supply source 250c may be further included in the gas supply unit. The O$_2$ gas supply source 250a may be further included in the oxygen-containing gas supply system. The H$_2$ gas supply source 250b may be further included in the hydrogen-containing gas supply system. The Ar gas supply source 250c may be further included in the inert gas supply system.

(Exhaust Unit)

A gas exhaust port 235 is installed at a sidewall of the lower container 211 to exhaust a reactive gas from the inside of the process chamber 201. An upstream side of the gas exhaust pipe 231 is connected to the gas exhaust port 235. At the gas exhaust pipe 231, an auto pressure controller (APC) 242 serving as a pressure adjustor (pressure adjustment unit), a valve 243b serving as an opening/closing valve, and a vacuum pump 246 serving as a vacuum exhaust device are sequentially installed starting from an upstream side.

An exhaust unit according to the present embodiment mainly includes the gas exhaust port 235, the gas exhaust pipe 231, the APC 242, and the valve 243b. The vacuum pump 246 may be further included in the exhaust unit.

(Plasma Generation Unit)

The resonance coil 212 is installed as a first electrode in a screw shape to surround the process chamber 201, i.e., external sides of sidewalls of the upper container 210, to encompass the process chamber 201. The resonance coil 212 is connected to a radio-frequency (RF) sensor 272, a high-frequency power source 273, and a frequency matching device 274.

The high-frequency power source 273 is configured to supply high-frequency power to the resonance coil 212. The RF sensor 272 is installed at an output side of the high-frequency power source 273. The RF sensor 272 is configured to monitor information regarding high-frequency progressive/reflected waves supplied. The frequency matching device 274 is configured to control the high-frequency power source 273 to minimize the reflected waves, based on the information regarding the reflected waves monitored by the RF sensor 272.

The diameter, pitch, and number of turns of the resonance coil 212 are set to resonate the resonance coil 212 in a predetermined wavelength mode in order to form stationary waves having a predetermined wavelength. That is, an electrical length of the resonance coil 212 is set to be an integer multiple of (e.g., to be one, two times, etc.) one wavelength of power supplied from the high-frequency power source 273 at a predetermined frequency. For example, one wavelength of the supplied power is equal to about 22 meters at 13.56 MHz, about 11 meters at 27.12 MHz, and about 5.5 meters at 54.24 MHz. The resonance coil 212 is formed of an insulating material and in a flat panel shape, and is supported by a plurality of supports standing vertically on an upper surface of a base plate 448.

Although both ends of the resonance coil 212 are electrically grounded, at least one end of the resonance coil 212 is grounded via a movable tap 213 to finely adjust the electrical length of the resonance coil 212 when the device is initially installed or process conditions are changed. In FIG. 1, reference numeral '214' denotes a fixed ground in a different direction. Also, when the device is initially installed or process conditions are changed, a power feeding unit is configured by the movable tap 213 between both ends of the grounded resonance coil 212 to finely adjust impedance of the resonance coil 212.

That is, the resonance coil 212 includes electrically grounded ground units at both ends thereof, and further includes the power feeding unit configured to supply power from the high-frequency power source 273 between the ground units. At least one of the ground units may be a variable ground unit, the location of which is variable. The power feeding unit may be a variable power feeding unit, the location of which is variable. When the resonance coil 212 includes the variable ground unit and the variable power feeding unit, a resonance frequency and load impedance of the process chamber 201 may be adjusted in a simpler way as will be described below. A principle of plasma generation will be described below.

A shielding plate 223 is installed to not only prevent electromagnetic waves from leaking outside the resonance coil 212 but also form capacitive components (which are needed to form a resonator circuit) between the shielding plate 223 and the resonance coil 212. In general, the shielding plate 223 is formed in a cylindrical shape using a conductive material such as an aluminum alloy, copper, or a copper alloy. The shielding plate 223 is spaced, for example, about 5 to 150 mm from the outer peripheral portion of the resonance coil 212.

The RF sensor 272 is installed at an output terminal of the high-frequency power source 273, and monitors progressive waves, reflected waves, etc. The power of the reflected waves monitored by the RF sensor 272 is input to the frequency matching device 274. The frequency matching device 274 performs frequency control to minimize the reflected waves.

A plasma generation unit according to the present embodiment mainly includes the resonance coil 212, the RF sensor 272, and the frequency matching device 274. The high-frequency power source 273 may be further included in the plasma generation unit.

Figure 2:
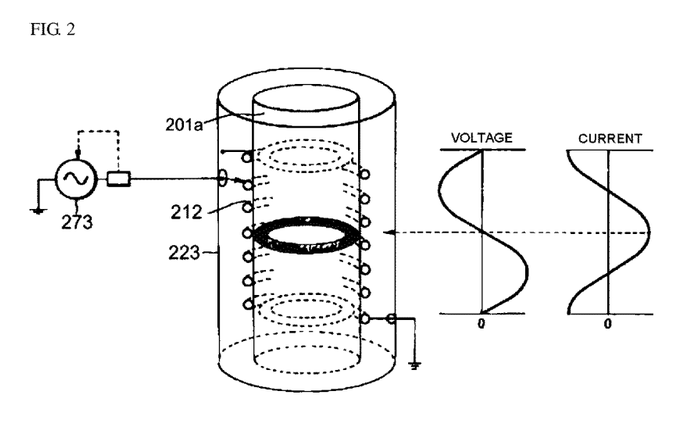
FIG. 2 a diagram illustrating a principle of generating plasma using a substrate processing apparatus according to an exemplary embodiment of the present invention.

The principle of plasma generation of the apparatus according to the present embodiment and the properties of the generated plasma will now be described with reference to FIG. 2.

The diameter, pitch, and number of turns of the resonance coil 212 are set to resonate the resonance coil 212 in a full wavelength mode so as to form stationary waves having a predetermined wavelength. That is, the electrical length of the resonance coil 212 is set to be an integer multiple of (e.g., to be one, two times, etc.) one wavelength of power supplied from the high-frequency power source 273 at a predetermined frequency.

Specifically, the resonance coil 212 is formed having an effective cross-sectional area of 50 mm$^2$ to 300 mm$^2$ and a diameter of 200 mm to 500 mm and is wound around an outer peripheral portion of the plasma generation space 201a two to sixty times so as to generate a magnetic field of about 0.01 to 10 gausses from high-frequency power, e.g., 800 kHz to 50 MHz or 0.5 kW to 5 kW, in consideration of the intensity of power supplied, the intensity of a magnetic field generated, or the exterior of an apparatus to be used. Also, the resonance coil 212 may be formed of a copper pipe, a thin copper plate, an aluminum pipe, a thin aluminum plate, a polymer belt on which copper or aluminum is deposited, etc.

One end or both ends of the resonance coil 212 are finely adjusted when the electrical length of the resonance coil 212 is set, and are generally grounded via the movable tap to substantially equalize resonating characteristics thereof with those of the high-frequency power source 273. A waveform adjustment circuit including a coil and a shield is inserted into one end (or another end or both ends) of the resonance coil 212 so that a phase/anti-phase current may flow to be symmetric with respect to an electrical central point on the resonance coil 212. The waveform adjustment circuit is configured as an open path by configuring an end portion of the resonance coil 212 to be in a floating state or in a state equivalent thereto. Also, an end portion of the resonance coil 212 may be ungrounded using a choke resistor and connected in series to a fixed reference electric potential.

The shielding plate 223 is installed to not only block an external electric field of the resonance coil 212 but also form a capacitance component (C-component), which is needed to form a resonator circuit, between the shielding plate 223 and the resonance coil 212. In general, the shielding plate 223 is formed in a cylindrical shape using a conductive material such as an aluminum alloy, copper, or a copper alloy. The shielding plate 223 is spaced about 5 to 150 mm from the outer peripheral portion of the resonance coil 212. Although the shielding plate 223 is generally grounded to have the same electric potential as both ends of the resonance coil 212, one end or both ends of the shielding plate 223 are configured such that the position of the tap are adjustable to precisely set the number of times of resonating the resonance coil 212. Otherwise, a trimming capacitor may be inserted between the resonance coil 212 and the shielding plate 223 to precisely set the number of times of resonating the resonance coil 212.

The high-frequency power source 273 includes a power control unit (control circuit) including a high-frequency oscillating circuit and a preamplifier to regulate an oscillating frequency and output, and an amplifier (output circuit) configured to amplify an output to a desired degree. The power control unit controls the amplifier based on a frequency set beforehand using a manipulation panel and power outputting conditions. The amplifier supplies high-frequency power of a predetermined intensity to the resonance coil 212 via a transmission path.

The plasma generation circuit configured by the resonance coil 212 includes a parallel RLC resonator circuit. When a wavelength of the high-frequency power source 273 and the electrical length of the resonance coil 212 are the same, resonance conditions of the resonance coil 212 become pure resistance due to an offset of a reactance component formed by the capacitance component and inductive component of the resonance coil 212. However, when the plasma generation circuit generates plasma, a capacitance coupling between a voltage unit of the resonance coil 212 and the plasma, an inductive coupling between the plasma generation space 201a and the plasma, or an actual resonance frequency slightly varies when the plasma is in an excited state.

Thus, in the present embodiment, the frequency matching device 274 compensates for an output by detecting reflected wave power from the resonance coil 212 when plasma is generated so that a resonance mismatch occurring in the resonance coil 212 when the plasma is generated may be compensated for at a power source side. Due to the configuration described above, a resonance apparatus according to the present invention is capable of more precisely forming stationary waves using the resonance coil 212 and generating plasma causing very low capacitance coupling.

That is, when plasma is generated, the frequency matching device 274 detects reflected wave power from the resonance coil 212, and increases or decreases the predetermined frequency to minimize the reflected wave power. Specifically, the frequency matching device 274 includes a frequency control circuit to correct a predetermined oscillating frequency. Also, a reflected wave power meter which is a part of the frequency matching device 274 is installed at an output side of the amplifier to detect reflected wave power at a transmission line and feed a voltage signal of the reflected wave power back to the frequency control circuit.

The frequency control circuit includes an analog/digital (A/D) converter configured to receive the voltage signal from the reflected wave power meter and digital-convert the voltage signal into a frequency signal, an arithmetic processing circuit configured to add/subtract a value of a frequency signal corresponding to the converted reflected wave and a preset value of an oscillating frequency, a digital/analog (D/A) converter configured to analog-convert a value of a frequency obtained by adding/subtracting into a voltage signal, and a voltage-controlled oscillator configured to oscillate according to a voltage applied from the D/A converter. Thus, the frequency control circuit oscillates at a no-load resonance frequency of the resonance coil 212 before plasma is lighted and oscillates at a frequency obtained by increasing or decreasing the predetermined frequency to minimize the power of the reflected wave after plasma is lighted, thereby amplifying the frequency signal to cause the intensity of the reflected wave at the transmission line to be zero.

In the present embodiment, the inside of the plasma generation space 201a is depressurized to, for example, 0.01 to 50 Torr, and a gas for plasma (an oxygen-containing gas in the present embodiment) is supplied into the plasma generation space 201a while maintaining the degree of vacuum of the plasma generation space 201a. Then, when high-frequency power, e.g., 27.12 MHz or 2 kW, is supplied to the resonance coil 212 from the high-frequency power source 273, an induced electric field occurs in the plasma generation space 201a, and the supplied gas is thus in a plasma state in the plasma generation space 201a.

The frequency matching device 274 installed in the high-frequency power source 273 compensates for a resonance mismatch occurring in the resonance coil 212 caused by a variation in a capacitance/inductive coupling of plasma generated. That is, the RF sensor 272 of the frequency matching device 274 detects reflected wave power generated due to a variation in the capacitance/inductive coupling of plasma generated, increases the predetermined frequency by a degree corresponding to a mismatch in the resonance frequency causing the reflected wave power to occur to minimize the reflected wave power, and then outputs a high frequency of the resonance frequency of the resonance coil 212 to the amplifier under plasma conditions.

In other words, the resonance apparatus according to the present invention is capable of precisely outputting a high frequency of a resonance frequency to correspond to a resonance mismatch in the resonance coil 212 when plasma is generated or when plasma generation conditions change, thereby causing the resonance coil 212 to more precisely form stationary waves. That is, since stationary waves having a state in which a phase voltage and an anti-phase voltage are always offset to each other due to an actual resonance frequency containing plasma transmitted from the resonator circuit are formed in the resonance coil 212 as illustrated in FIG. 2, a highest phase current is formed at an electrical central point (node having a voltage of zero) on the resonance coil 212. Thus, capacitance coupling hardly occurs between induced plasma excited at the electrical central point and a wall of the process chamber or the substrate mounting table, and plasma having a donut shape and an extremely low electric potential may be formed in the plasma generation space 201a.

(Control Unit)

A controller 221 serving as a control unit is configured to control the APC 242, the valve 243b, and the vacuum pump 246 via a signal line A; the susceptor elevating mechanism 268 via a signal line B; the heater 217b and the impedance varying mechanism 275 via a signal line C; the gate valve 244 via a signal line D, the RF sensor 272, the high-frequency power source 273, and the frequency matching device 274 via a signal line E; and the mass flow controllers 252a, 252b, and 252c and the valves 253a, 253b, 253c, and 243a via a signal line F.

(2) Substrate Processing Process

Figure 3:
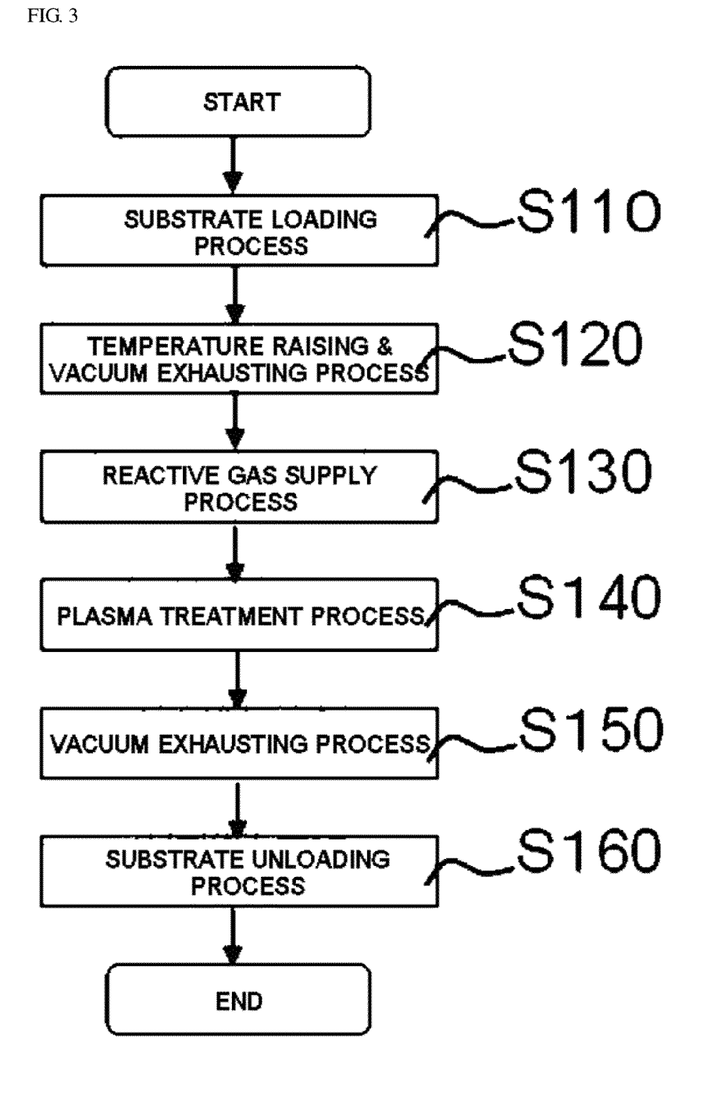
FIG. 3 a flowchart illustrating a substrate processing process according to a first embodiment of the present invention.

A substrate processing process according to the present embodiment will now be described mainly with reference to FIG. 3. FIG. 3 is a flowchart illustrating a substrate processing process according to the first embodiment of the present invention. The substrate processing process according to the present embodiment is a process included in a process of manufacturing a semiconductor device such as a flash memory, and is performed by the substrate processing apparatus 100 described above. In the following description, operations of the elements of the substrate processing apparatus 100 are controlled by the controller 221.

Figure 4:
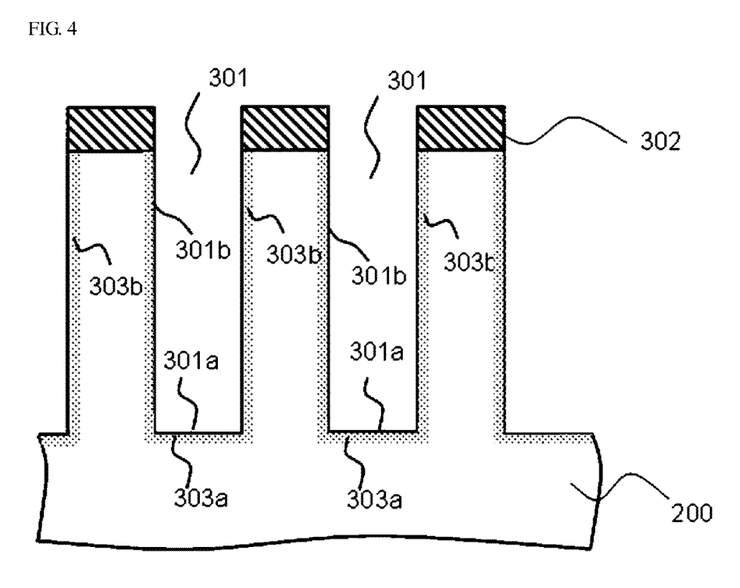
FIG. 4 a diagram illustrating a substrate including grooves (trenches) to be processed using the substrate processing process according to the first embodiment of the present invention.

At surfaces of the wafers 200 processed using the substrate processing process according to the present embodiment, for example, trenches 301 including a concavo-convex structure having a high aspect ratio are formed beforehand as illustrated in FIG. 4. The trenches 301 are obtained by, for example, forming a mask layer 302 having a predetermined pattern on the wafers 200, and etching the surfaces of the wafer 200 to a predetermined depth.

In the present embodiment, oxidation is performed on inner walls of the trenches 301. In this case, the substrate processing apparatus 100 is controlled to increase step coverage that is a ratio between the thicknesses of an oxide film formed on a bottom portion 301a and a side portion 301b of the trenches 301, as will be described in detail below.

(Substrate Loading Process S110)

First, the wafers 200 are loaded into the process chamber 201. Specifically, the susceptor elevating mechanism 268 moves the susceptor 217 downward to a location at which the wafers 200 are to be transferred so that the wafer elevating pins 266 may pass through the through-holes 217a of the susceptor 217. As a result, the wafer elevating pins 266 come to protrude by a predetermined height from a surface of the susceptor 217.

Then, the gate valve 244 is opened to load the wafers 200 into the process chamber 201 from a vacuum transfer chamber (not shown) adjacent to the process chamber 201 using the transfer mechanism which is not shown. Then, the wafers 200 are supported in a horizontal posture on the wafer elevating pins 266 protruding from the surface of the susceptor 217. When the wafers 200 are loaded into the process chamber 201, the transfer mechanism is retreated from the process chamber 201, the gate valve 244 is closed, and the inside of the process chamber 201 is air-tightly closed. Then, the susceptor elevating mechanism 268 moves the susceptor 217 upward such that the susceptor 217 is placed on a predetermined location between a lower end 203a of the resonance coil 212 and an upper end 245a of the loading port 245. Thus, the wafers 200 are supported on an upper surface of the susceptor 217. Alternatively, the substrate loading process S110 may be performed while the inside of the process chamber 201 is purged with an inert gas or the like.

(Temperature Raising & Vacuum Exhausting Process S120)

Then, temperatures of the wafers 200 loaded into the process chamber 201 are increased. The wafers 200 are heated to a predetermined temperature that is, for example, greater than or equal to 150° C. and less than or equal to 650° C. by preheating the heater 217b and supporting the wafers 200 on the susceptor 217 in which the heater 217b is embedded. Here, the wafers 200 are heated to 600° C. While the temperatures of the wafers 200 are increased, the inside of the process chamber 201 is vacuum-exhausted by the vacuum pump 246 via the gas exhaust pipe 231 so that the pressure in the process chamber 201 may have a predetermined value that is greater than or equal to 0.1 Pa and less than or equal to 1,000 Pa. For example, the pressure in the process chamber 201 is adjusted to 200 Pa. The vacuum pump 246 is continuously operated at least until a substrate unloading process S160 to be described below is completed.

(Reactive Gas Supply Process S130)

Then, $O_2$ gas serving as a reactive gas is started to be supplied. Specifically, the valve 253a is opened, and the $O_2$ gas is started to be supplied into the process chamber 201 via the buffer chamber 237 while the flow rate of the $O_2$ gas is controlled by the mass flow controller 252a. In this case, the flow rate of the $O_2$ gas is controlled to be a predetermined value that is, for example, greater than or equal to 100 sccm and less than or equal to 1,000 sccm. Also, the inside of the process chamber 201 is exhausted by adjusting the degree of opening the APC 242 such that the inside of the process chamber 201 has a predetermined pressure that is, for example, greater than or equal to 1 Pa and less than or equal to 1,000 Pa. The $O_2$ gas is continuously supplied into the process chamber 201 while appropriately exhausting the inside of the process chamber 201 as described above, until a plasma treatment process S140 to be described below is completed.

(Plasma Treatment Process S140)

When the pressure in the process chamber 201 is stable, high-frequency power is started to be supplied to the resonance coil 212 from the high-frequency power source 273.

Thus, a high-frequency electric field is formed in the plasma generation space 201a. In the high-frequency electric field, induced plasma having a donut shape is excited at a location having a height corresponding to the electrical central point on the resonance coil 212 in the plasma generation space. The plasma-stated $O_2$ gas is dissociated to produce reactive species, e.g., oxygen active species or ions containing oxygen (O).

As described above, the stationary waves having a state in which a phase voltage and an anti-phase voltage are always offset to each other and are formed to produce a highest phase current at the electrical central point (node having a voltage of zero) on the resonance coil 212. Thus, capacitance coupling hardly occurs between the induced plasma excited at the electrical central point and a wall of the process chamber or the substrate mounting table, and plasma having a donut shape and an extremely low electric potential may be formed in the plasma generation space 201a.

Also, as described above, the power control unit included in the high-frequency power source 273 is capable of compensating for a resonance mismatch in the resonance coil 212 caused by a variation in plasma capacitance/inductive coupling and more precisely forming stationary waves. Thus, plasma that hardly causes capacitance coupling and that has an extremely low electric potential may be formed in the plasma generation space.

Since plasma having an extremely low electric potential is generated, a sheath may be prevented from occurring on a wall of the plasma generation space 201a or the substrate mounting table. Accordingly, ions in the plasma are not accelerated.

In the substrate processing space 201b, oxygen radicals and non-accelerated ions are evenly supplied into the trenches 301 in the wafers 200 retained on the susceptor 217. The supplied radicals and ions evenly react with the bottom and side portions 301a and 301b of the sidewalls of the trenches 301 to modify a silicon film (silicon containing layer) into a silicon oxide film having high step coverage. Also, the wafers 200 may be suppressed from being damaged by the ions since attacks of accelerated ions may be prevented.

Since the ions are prevented from being accelerated, sputtering does not occur on peripheral walls of the plasma generation space 201a and the peripheral walls of the plasma generation space 201a may be thus prevented from being damaged. Thus, the device lifespan may be increased, and components of, for example, the plasma generation space 201a may be prevented from being mixed into the plasma, thereby preventing the wafers 200 from being contaminated.

Also, the power control unit included in the high-frequency power source 273 is capable of compensating for reflected wave power generated due to an impedance mismatch occurring in the resonance coil 212 and supplementing a decrease in effective load power. Thus, high-frequency power having an initial level may always be securely supplied to the resonance coil 212, thereby stabilizing plasma. Accordingly, the wafers 200 retained in the substrate processing space 201b may be processed evenly and at a regular rate.

Thereafter, when a predetermined time, e.g., 10 to 300 seconds, passes, outputting of power from the high-frequency power source 273 is suspended and a plasma discharge in the process chamber 201 is suspended. Also, the valve 253a is closed, and the supply of the $O_2$ gas into the process chamber 201 is suspended, thereby completing the plasma treatment process S140.

Accordingly, the thicknesses of the oxide film formed on each of the bottom portions 301a and each of the side portions 301b of the trenches 301 may be uniform. That is, a film having high step coverage may be formed as will be described in detail below.

(Vacuum-Exhaust Process S150)

When the predetermined time passes and the supply of the $O_2$ gas is suspended, the inside of the process chamber 201 is vacuum-exhausted by the gas exhaust pipe 231. Thus, the $O_2$ gas supplied into the process chamber 201, an exhaust gas generated by the reaction of the $O_2$ gas, or the like is exhausted from the process chamber 201. Then, the degree of opening the APC 242 is adjusted to control the pressure in the process chamber 201 to be the same as the pressure (e.g., 100 Pa) in the vacuum transfer chamber (location at which the wafers 200 are to be unloaded, not shown) adjacent to the process chamber 201.

(Substrate Unloading Process S160)

When the inside of the process chamber 201 has a predetermined pressure, the susceptor 217 is moved downward to the location at which the wafers 200 are to be transferred, and the wafers 200 are supported on the wafer elevating pins 266. Then, the gate valve 244 is opened, and the wafers 200 are unloaded from the process chamber 201 using the transfer mechanism which is not shown. In this case, the wafers 200 may be unloaded from the process chamber 201 while the inside of the process chamber 201 is purged with an inert gas or the like. Thereafter, the substrate processing process according to the present embodiment is completed.

Figure 5:
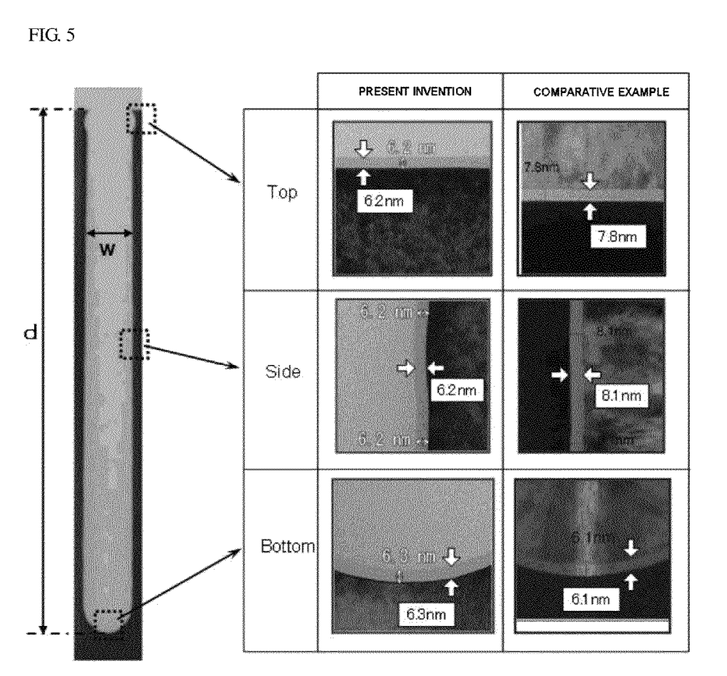
FIG. 5 a diagram comparing a groove (trench) processed using the substrate processing process according to the first embodiment of the present invention with a groove (trench) processed using a substrate processing process according to a comparative example of the present invention.

FIG. 5 is a diagram comparing a trench processed using the substrate processing process according to an embodiment of the present invention with a trench processed using a substrate processing process according to a comparative example of the present invention. In the comparative example, an oxide film is formed by thermal oxidation without using plasma.

In FIG. 5, the left drawing is an enlarged view of a trench having a depth d of 2.0 µm and a width w of 0.2 µm, and the right drawings are enlarged views of the top, side, and bottom portions of trenches processed according to the first embodiment and the comparative example of the present invention. In the right drawings, numerical values denote the thicknesses of formed films.

Referring to the right drawings, the thicknesses of the top, side, and bottom portions of the film formed according to the first embodiment of the present invention are 6.2 nm, 6.2 nm, and 6.3 nm, respectively. Thus, the ratio between the thicknesses of the side and bottom portions of the film (Side/Bottom) is 0.98, and the ratio between the thicknesses of the top and bottom portions of the film (Top/Bottom) is 0.98.

In contrast, the thicknesses of the top, side, and bottom portions of the film formed according to the comparative example are 7.8 nm, 8.1 nm, and 6.1 nm, respectively. Thus, the ratio between the thicknesses of the side and bottom portions of the film (side/bottom) is 1.33, and the ratio between the thicknesses of the top and bottom portions of the film (top/bottom) is 1.28.

As described above, step coverage when plasma oxidation according to the present invention is used is higher than when thermal oxidation according to the comparative example is used. By forming a film having high step coverage, a semiconductor device may have uniform characteristics and non-uniformity in the performance of the semiconductor device may be reduced.

(3) Effects of the Present Embodiment

According to the present embodiment, one or more of the effects described below can be achieved.

(a) According to the present embodiment, locations of a resonance coil and a substrate may be controlled to oxidize side and bottom portions of grooves. Thus, thicknesses of a film formed in the side and bottom portions of the trenches may be controlled to be the same, thereby obtaining high step coverage.

(b) Also, according to the present embodiment, an electric field formed in the process chamber 201 is a high-frequency electric field having a frequency according to an aspect ratio of the trenches 301. Thus, high-density plasma may be obtained, reactive species are highly likely to arrive at the bottom portions of 301a of the trenches 301, and the efficiency of processing the insides of the trenches 301 may be improved, thereby enabling a more fine and rapid processing.

(c) In the substrate processing space 201b, oxygen radicals and non-accelerated ions are gently and evenly supplied into the trenches 301 of the wafers 200 retained on the susceptor 217. The supplied radicals and ions evenly react with the bottom and side portions 301a and 301b to modify a silicon film into a silicon oxide film having high step coverage. Also, attacks of accelerated ions may be prevented, thereby suppressing the wafer from being damaged.

(d) Since acceleration of the ions is prevented, sputtering does not occur on the peripheral walls of the plasma generation space 201a, and the peripheral walls of the plasma generation space 201a may be thus prevented from being damaged. As a result, a device lifespan may be improved, and components of, for example, the plasma generation space 201a may be prevented from being mixed into plasma, thereby preventing the wafer from being contaminated.

(e) The power control unit included in the high-frequency power source 273 is capable of compensating for reflected wave power generated due to an impedance mismatch occurring at the resonance coil 212, and compensating for a decrease in effective load power. Thus, high-frequency power having an initial level may always be securely supplied to the resonance coil 212, thereby stabilizing plasma. Accordingly, the wafer retained in the substrate processing space may be processed evenly at a regular rate.

Although processing of the trenches 301 has been described in the present embodiment, various films, such as a gate insulating film or a metal film (metal containing layer), that are formed on the wafer 200 may be processed.

Also, although oxidation using $O_2$ gas has been described in the present embodiment, a rare gas, e.g., helium (He) gas or argon (Ar) gas, may be used instead of the $O_2$ gas.

In the present embodiment, a pattern including the trenches 301 with a concavo-convex structure having a high aspect ratio as illustrated in FIG. 4 is used. However, oxidation may be performed on a floating electrode 603 formed as illustrated in FIG. 6 in a process included in a process of manufacturing, for example, a three-dimensionally stacked flash memory as a film including such a pattern.

Figure 6:
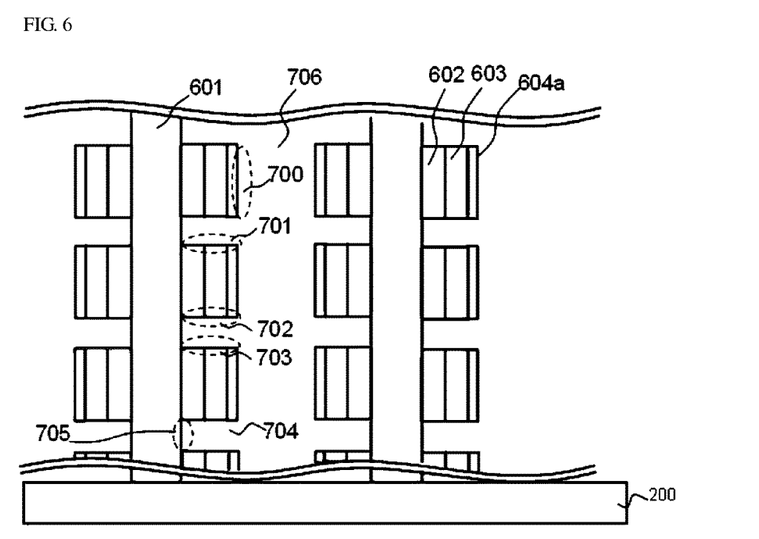
FIG. 6 a diagram illustrating a substrate including grooves (trenches) processed using the substrate processing process according to the first embodiment of the present invention.

FIG. 6 will now be described in detail. A plurality of cylindrical insulators 601 are formed on a surface of a wafer 200. Although FIG. 6 illustrates two cylindrical insulators 601, a plurality of cylindrical insulators (not shown) are disposed adjacent to one another at fine intervals.

A channel layer is formed on of the cylindrical insulators 601. A gate insulating film 602 and a floating gate layer 603 are sequentially stacked in correspondence to the channel layer in a direction perpendicular to a direction in which the cylindrical insulators 601 extend. The resultant stacked structure is referred to as a stacked structure of a flash memory. Here, the direction perpendicular to the direction in which the cylindrical insulators 601 extend is parallel to the surface of the wafer 200.

Another pattern is formed in a direction in which the stacked structure of the flash memory extends. For example, another stacked structure of a flash memory including a gate insulating film 602 and a floating gate layer 603 formed on an adjacent cylindrical insulator 601 is formed. A narrow space is formed between a front end of the stacked structure of the flash memory and the other pattern (here, between the opposite floating gate layers 603). A plurality of stacked structures of flash memories stacked in the direction perpendicular to the direction in which the cylindrical insulators 601 extend are formed parallel to one another at sides of the direction in which the cylindrical insulators 601 extend. A miniaturizing process is also performed between the stacked structures of the flash memories.

In such a fine three-dimensional (3D) pattern, a film needs to be uniformly formed on, for example, a front end 700 of the stacked structure, a side surface 701 of the stacked structure oriented in a gas-supplying direction, a side surface 702 of the stacked structure opposite to the side surface 701 oriented in the gas-supplying direction, and a side surface 703 adjacent to the side surface 702 so as to improve device performance. Similarly, a film needs to be uniformly formed on a bottom surface 705, which is a bottom portion of a groove 704 between stacked structures.

Although a fine 3D pattern is considered to be processed using a conventional chemical vapor deposition (CVD) apparatus, a film is grown in a gaseous phase and so-called voids or seams are formed on this pattern. Thus, it is difficult to evenly form a film.

In a substrate processing method according to the present invention, oxygen radicals and non-accelerated ions are gently and evenly supplied into a trench 706. Thus, the supplied radicals and ions are evenly supplied onto the front end 700, the side surfaces 701 to 703, and the bottom surface 705 of the stacked structure. Thus, silicon applied onto the front end 700, the side surfaces 701 to 703, and the bottom surface 705 of the stacked structure may be evenly oxidized and modified into a silicon oxide film having high step coverage. In other words, a silicon oxide film having high step coverage may be formed. Also, attacks of accelerated ions may be prevented to suppress a wafer from being damaged.

In particular, in the stacked structure of the flash memory illustrated in FIG. 6, a front end of the floating electrode 603 formed of polysilicon may be evenly oxidized and a silicon oxide layer 604a included in an oxide-nitride-oxide (ONO) layer which is a charge-accumulation layer may be evenly formed within planes of a substrate.

Also, the present embodiment has been described above with respect to the pattern in which the trenches 301 including a concavo-convex structure having a high aspect ratio illustrated in FIG. 4 are formed. For example, a film with such a pattern may be a pattern structure adjacent to another device structure. In this case, a high-density pattern is present.

Although such a fine pattern is considered to be processed using a conventional CVD apparatus, the thickness of a film within planes of a substrate is expected to vary due to a high-density pattern.

In the substrate processing method according to the present invention, since oxygen radicals and non-accelerated ions are gently and evenly supplied into the trench 706, a substrate may be processed uniformly even when the pattern density is high. In other words, a silicon oxide film having high step coverage may be formed regardless of a high-density pattern. Also, attacks of accelerated ions may be prevented and wafers may be thus suppressed from being damaged due to ions.

Although a pattern including trenches having a concavo-convex structure having a high aspect ratio has been described above, the present invention is not limited thereto and the gate insulating film 602 which is a silicon oxide film may be formed by performing oxidation according to the present invention on, for example, a silicon film formed in a process included in a process of manufacturing a three-dimensionally stacked flash memory.

Second Embodiment

Figure 7:
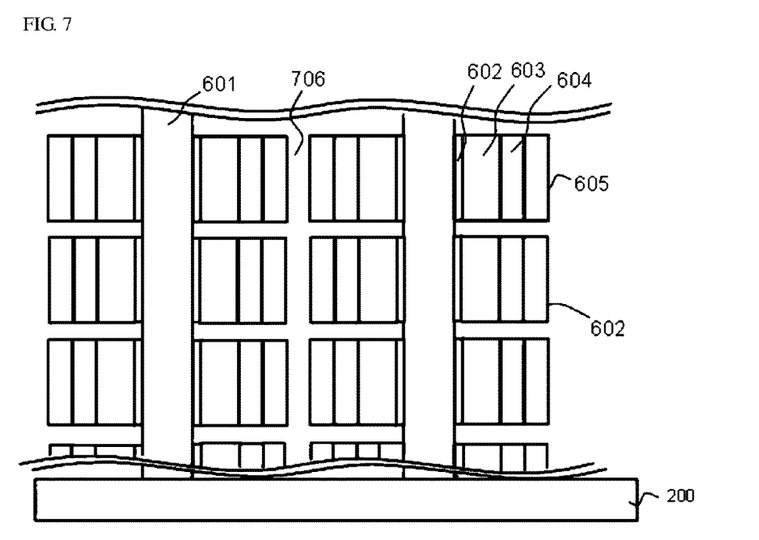
FIG. 7 a diagram illustrating a substrate having grooves (trenches) processed using a substrate processing process according to a second embodiment of the present invention.
Figure 8:
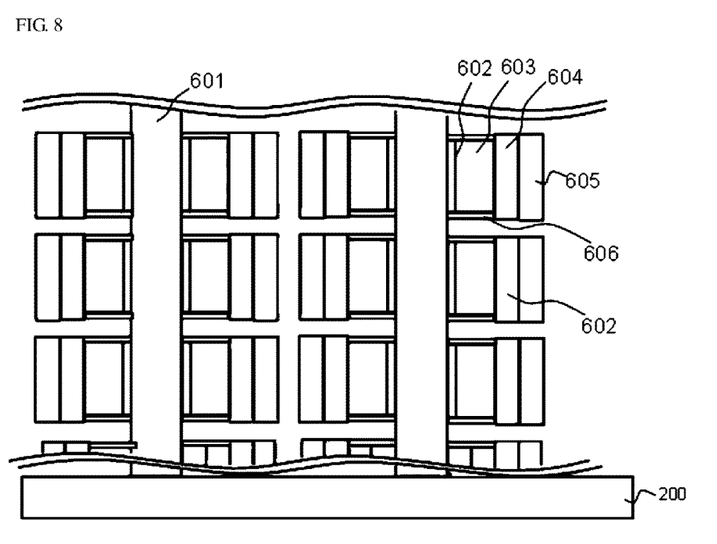
FIG. 8 a diagram illustrating a substrate having grooves (trenches) processed using a substrate processing process according to the second embodiment of the present invention.

Next, a second embodiment of the present invention will be described with reference to FIGS. 7 and 8. FIGS. 7 and 8 are diagrams illustrating the structures of a three-dimensionally stacked flash memory. The second embodiment is different from the first embodiment in the following ways. First, the second embodiment is different from the first embodiment in terms of the pattern of a film formed on wafers processed using a substrate processing process. Second, operations S130 and S140 of the substrate processing process illustrated in FIG. 3 according to the first embodiment are not the same as those according to the second embodiment. Operations of S110, S120, S150, and S160 illustrated in FIG. 3 according to the first embodiment are the same as the corresponding operations according to the second embodiment. The substrate processing apparatus employed in the first embodiment is also used in the second embodiment.

A pattern of FIG. 7 is a pattern that is not processed using the substrate processing process according to the second embodiment, and a pattern of FIG. 8 is a result obtained by processing the pattern of FIG. 7 using the substrate processing process according to the second embodiment. The pattern of FIG. 7 is a pattern processed using a process included in a process of manufacturing, for example, a three-dimensionally stacked flash memory, and includes a charge-accumulated layer 604 and a control electrode 605 (metal containing layer) compared to the device structure illustrated in FIG. 6.

A substrate processing method according to the present embodiment will be described in detail below.

(1) Substrate Processing Process

A substrate processing process according to the present embodiment will now be described. The substrate processing process according to the present embodiment is a process included in a process of manufacturing a semiconductor device, for example, a flash memory, and is performed by the substrate processing apparatus 100 described above. In the following description, the operations of the elements of the substrate processing apparatus 100 are controlled by the controller 221.

For example, a plurality of cylindrical insulators 601 are formed on surfaces of wafers 200 processed using the substrate processing process according to the present embodiment as illustrated in FIG. 7. Although FIG. 7 illustrates two cylindrical insulators 601, a plurality of cylindrical insulators (not shown) are formed adjacent to one another at fine intervals.

A channel layer is formed on the cylindrical insulators 601. A gate insulating film 602, a floating gate layer 603, a charge-accumulated layer 604, and a control electrode 605 are sequentially stacked to correspond to the channel layer in a direction perpendicular to a direction in which the cylindrical insulators 601 extend. The resultant structure is referred to as a stacked structure of a flash memory. Here, the direction perpendicular to the direction in which the cylindrical insulators 601 extend is a direction that is parallel to the surfaces of the wafers 200. The stacked structure is formed by, for example, etching such as dry etching.

Another pattern, e.g., another stacked structure of a flash memory including a gate insulating film 602 and a floating gate layer 603 formed on a cylindrical insulator 601, is formed in a direction in which the stacked structure of the flash memory extends. A narrow space is formed between a front end of the stacked structure of the flash memory and the other pattern (here, between control electrodes 605 facing each other). A plurality of stacked structures of flash memories stacked in the direction perpendicular to the direction in which the cylindrical insulators 601 extend are formed parallel to one another at sides of the direction in which the cylindrical insulators 601 extend. A miniaturizing process is also performed between the stacked structures of the flash memories formed in the direction in which the cylindrical insulators 601 extend.

As described above, etching is performed to form the above pattern but a side surface of the floating gate layer 603 formed of a polysilicon film or a side surface of the gate insulating film 602 formed of a silicon oxide film may be damaged by etching. In this case, a leak current may be generated from the floating gate layer 603 when the floating gate layer 603 is damaged.

Thus, the leak current is suppressed by restoring sidewalls of the floating gate layer 603 by forming an oxide film by oxidizing the sidewalls of the floating gate layer 603. However, when the stacked structure of the flash memory is exposed to an oxygen atmosphere to oxidize the floating gate layer 603, the control electrode 605 is also exposed to the oxygen atmosphere. Thus, the control electrode 605 may be oxidized and degraded. Also, the floating gate layer 603 is formed at a location adjacent to the cylindrical insulator 601. That is, the floating gate layer 603 is formed at the bottom of an ultrafine groove. Thus, a void or a seam is generated when the conventional CVD apparatus is used, thereby preventing an oxide film from being evenly formed.

Figure 9:
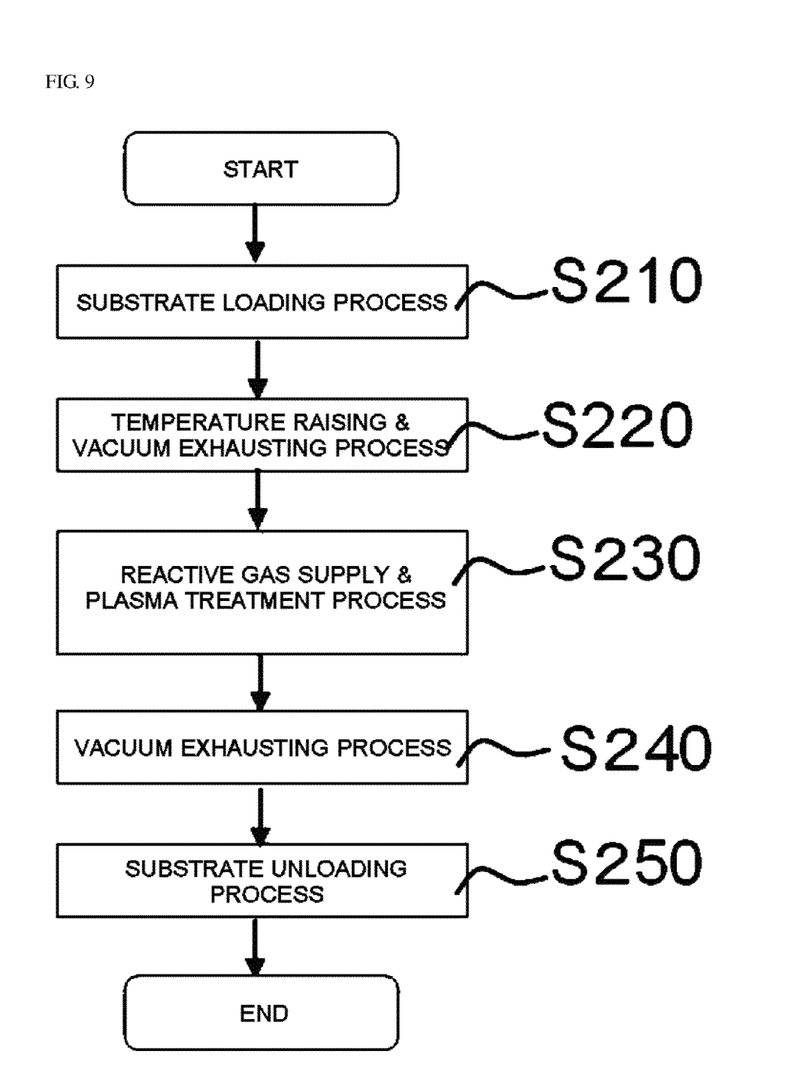
FIG. 9 a flowchart illustrating the substrate processing process according to the second embodiment of the present invention.

In the present embodiment, a method of suppressing sidewalls of a fine 3D pattern as in a 3D flash memory from being damaged and reducing a leak current will be described with reference to FIG. 9. The present embodiment is the same as the substrate processing process of FIG. 3 according to the first embodiment in the following ways. Specifically, operations S210, S220, S230, and S250 are the same as operations S110, S120, S150, and S160, respectively. Thus, the description of those operations will be omitted. A substrate processing process according to the present embodiment will be described in detail below.

(Substrate Loading Process S210)

First, a wafer 200 in which the pattern of FIG. 7 is formed is loaded into the process chamber 201. Specifically, the susceptor elevating mechanism 268 causes the wafer elevating pins 266 to pass through the through-holes 217a of the susceptor 217 by moving the susceptor 217 downward to a location at which the wafer 200 is to be transferred. As a result, the wafer elevating pins 266 protrude from a surface of the susceptor 217 by a predetermined height.

Then, the gate valve 244 is opened, and the wafer 200 is loaded into the process chamber 201 from the vacuum transfer chamber (not shown) adjacent to the process chamber 201 using the transfer mechanism which is not shown. Then, the wafer 200 is supported in a horizontal posture on the wafer elevating pins 266 protruding from the surface of the susceptor 217. When the wafer 200 is loaded into the process chamber 201, the transfer mechanism is retreated from the process chamber 201, the gate valve 244 is closed, and the inside of the process chamber 201 is air-tightly closed. Then, the susceptor elevating mechanism 268 moves the susceptor 217 upward to a predetermined location between the lower end 203a of the resonance coil 212 and the upper end 245a of the loading port 245. Then, the wafer 200 is supported on the upper surface of the susceptor 217. The substrate processing process S210 may be performed while the inside of the process chamber 201 is purged with an inert gas or the like.

(Temperature Raising & Vacuum Exhausting Process S220)

Then, the temperature of the wafer 200 loaded into the process chamber 201 is increased. The wafer 200 is heated to, for example, a temperature that is greater than or equal to 150° C. and less than or equal to 650° C. by preheating the heater 217b and retaining the loaded wafer 200 on the susceptor 217 in which the heater 217b is embedded. Here, the wafer 200 is heated to 600° C. While the temperature of the wafer 200 is increased, the inside of the process chamber 201 is vacuum-exhausted by the vacuum pump 246 via the gas exhaust pipe 231 such that the inside of the process chamber 201 has a predetermined pressure that is greater than or equal to 0.1 Pa and less than or equal to 1,000 Pa. For example, the pressure in the process chamber 201 is adjusted to 200 Pa. The vacuum pump 246 is continuously operated at least until a substrate unloading process to be described below is completed.

(Reactive Gas Supply & Plasma Treatment Process S230)

Next, $O_2$ gas and $H_2$ gas are started to be supplied as reactive gases, as will be described in detail below.

(Process of Controlling the Flow Rate of a Mixture Gas)

The valves 253a, 253b, and 253c are opened, and a mixture gas of $O_2$ gas, $H_2$ gas, and Ar gas is introduced (supplied) into the process chamber 201 via the buffer chamber 237. When the mixture gas is supplied, the inside of the process chamber 201 may be controlled to have a predetermined pressure by supplying $H_2$ gas into the process chamber 201 before the mixture gas is supplied. In this case, when the supply of the mixture gas starts, the control electrode 605 may be suppressed from being rapidly oxidized while the pressure in the process chamber 201 is maintained.

Also, the degree of opening the APC 242 is controlled such that the inside of the process chamber 201 has a predetermined pressure that is, for example, greater than or equal to 15 Pa and less than or equal to 250 Pa (120 Pa in the present embodiment) after the mixture gas is supplied.

After a predetermined time (for example, several seconds) passes after the supply of the mixture gas starts, high-frequency power is started to be applied to the resonance coil 212 from the high-frequency power source 273. Thus, a high-frequency electric field is formed in the plasma generation space 201a, and donut-shaped induced plasma is excited in this electric field at a location having a height corresponding to an electrical central point on the resonance coil 212 in the plasma generation space 201a. $O_2$ gas and $H_2$ gas that are in the form of plasma are dissolved to produce reactive species containing oxygen (O) or hydrogen (H), such as oxygen active species, oxygen ions, hydrogen active species, or hydrogen ions.

As described above, stationary waves having a state in which a phase voltage and an anti-phase voltage are always offset to each other are formed to produce a highest phase current on the electrical central point (node having a voltage of zero) on the resonance coil 212. Thus, the induced plasma excited on the electrical central point hardly causes capacitance coupling with a wall of the process chamber 201 or the substrate mounting table, and donut-shape plasma having an extremely low electric potential may be formed in the plasma generation space 201a.

Also, as described above, the power control unit included in the high-frequency power source 273 is capable of compensating for a resonance mismatch in the resonance coil 212 caused by a variation in plasma capacitance/inductive coupling, and more precisely forming stationary waves. Thus, plasma that hardly causes capacitance coupling and that has an extremely low electric potential may be more securely formed in the plasma generation space 201a.

Since the plasma having the extremely low electric potential is formed, a sheath may be prevented from being formed on the wall of the plasma generation space 201a or the substrate mounting table. Accordingly, ions in the plasma are not accelerated.

Oxygen radicals and non-accelerated ions are evenly supplied into the trenches 301 in the wafer 200 retained on the susceptor 217 in the substrate processing space 201b. The supplied radicals and ions evenly react with the bottom and side portions 301a and 301b of the trenches 301 to modify a silicon film into a silicon oxide film having high step coverage. Also, attacks of accelerated ions may be prevented, thereby suppressing the wafer 200 from being damaged by the ions.

Also, since the ions are prevented from being accelerated, sputtering does not occur on the peripheral walls of the plasma generation space 201a and the peripheral walls of the plasma generation space 201a may thus not be damaged. Thus, an apparatus lifespan may be increased, and components of, for example, the plasma generation space 201a may be prevented from being mixed into plasma, thereby preventing the wafer 200 from being contaminated.

By generating plasma as described above, the mixture gas of the $O_2$ gas, the $H_2$ gas, and the Ar gas is activated in the plasma generation space 201a in the process chamber 201. In this case, the rare gas (Ar gas) contributes to stabilization of a plasma discharge.

(Selective Oxidation Process)

Then, a mixture gas that is in a plasma state (i.e., that is in the form of plasma) is supplied onto the wafer 200 including the floating gate layer 603 and the control electrode 605, the sidewalls of which are exposed to perform plasma treatment (selective oxidation) on the wafer 200.

Specifically, when a mixture gas including $H_2$ gas, $O_2$ gas, and a rare gas (He gas) is activated by plasma, H, OH, and the like are generated. The OH reacts with a surface of a region including silicon applied onto the wafer 200 to oxidize the surface of the region, thereby forming an oxide film 606. The hydrogen has relatively low reducing properties with respect to the region including the silicon.

That is, when the OH reacts with the region including the silicon applied onto the wafer 200, a new oxide film is formed on a side surface of the region including the silicon (e.g., the gate insulating film 602 or the floating gate layer 603), thereby restoring damage of the region caused by etching.

In general, the OH has oxidizing properties and the H has reducing properties with respect to a surface of a region including metal on the wafer 200. For example, when the concentration of the OH is relatively high (or the concentration of the H is relatively low), the surface of the region including the metal on the wafer 200 is oxidized. That is, in this case, the rate of oxidation by the OH is greater than the rate of reduction by the H. When the concentration of the OH is relatively low (or the concentration of the H is relatively high), the surface of the region including the metal on the wafer 200 is not oxidized (i.e., the surface of the region is reduced). That is, in this case, the rate of reduction by the H is greater than the rate of oxidation by the OH.

In the present embodiment, the ratio of the flow rate of the $H_2$ gas to the sum of the flow rates of the $O_2$ gas and the $H_2$ gas contained in the mixture gas is controlled to be 40% or more, the degrees of opening the mass flow controllers 252a, 252b, and 252c are adjusted, and plasma treatment is performed on the wafer 200 using the mixture gas in the form of plasma. Thus, the rate of reduction by the H is greater than the rate of oxidation by the OH in the region including the metal on the wafer 200, and the surface of the region including the metal on the wafer 200 is suppressed from being oxidized (or is rapidly reduced even if the surface of the region is oxidized).

Then, when a predetermined time, e.g., 10 to 300 seconds, passes, outputting of power from the high-frequency power source 273 is suspended and a plasma discharge in the process chamber 201 is suspended. Also, the valve 253a is closed and the supply of the $O_2$ gas into the process chamber 201 is suspended, thereby completing the plasma treatment process S230.

The sidewalls of the floating gate layer 603 may be restored as described above even if a floating gate is formed adjacent to the cylindrical insulator 601 (i.e., at the bottom of an ultrafine groove) in a fine 3D pattern. When the floating gate layer 603 is restored, a leak current may be suppressed to prevent an adjacent device from being influenced by the leak current.

(Vacuum Exhaust Process S240)

When the predetermined time passes and the supply of the $O_2$ gas, the $H_2$ gas, and the Ar gas is suspended, the inside of the process chamber 201 is vacuum-exhausted using the gas exhaust pipe 231. By vacuum-exhausting the inside of the process chamber 201, the $O_2$ gas, the $H_2$ gas, and the Ar gas, or an exhaust gas generated from reaction of the $O_2$ gas may be exhausted from the process chamber 201. Then, the degree of opening the APC 242 is adjusted to equalize the pressure in the process chamber 201 with the pressure (e.g., 100 Pa) in the vacuum transfer chamber adjacent to the process chamber 201 (location at which the wafer 200 is to be unloaded, not shown).

(Substrate Unloading Process S250)

When the inside of the process chamber 201 becomes equal to a predetermined pressure, the wafer 200 is supported on the wafer elevating pins 266 by moving the susceptor 217 downward to the location at which the wafer 200 is to be unloaded. Then, the gate valve 244 is opened, and the wafer 200 is unloaded from the process chamber 201 using the transfer mechanism which is not shown. In this case, the wafer 200 may be unloaded from the process chamber 201 while the inside of the process chamber 201 is purged with an inert gas or the like. Then, the substrate processing process according to the present embodiment is completed.

(3) Effects of the Present Embodiment

According to the present embodiment, one or more of the effects described below can be achieved.

(a) According to the present embodiment, locations of a resonance coil and a substrate may be controlled to oxidize side and bottom portions of grooves. Thus, the thicknesses of a film formed on the side and bottom portions of the grooves may be controlled to be the same, thereby achieving high step coverage.

(b) Accordingly, in such a fine 3D pattern, sidewalls of a floating gate layer may be restored even on a film such as a floating gate formed adjacent to the cylindrical insulator 601, i.e., a film formed at the bottom of an ultrafine groove.

(c) By restoring the sidewalls of the floating gate layer, a leak current may be suppressed and an adjacent device may be thus suppressed from being influenced by the leak current.

In addition to the oxidation, the present invention may be applied to oxynitridation using oxidation and nitridation together, diffusion, film forming (film deposition), etching, or the like. For example, either an oxygen-containing gas such as oxygen ($O_2$) gas or a mixture gas obtained by adding a nitrogen-containing gas, a hydrogen-containing gas such as hydrogen ($H_2$) gas, or a rare gas to the oxygen-containing gas may be used to perform oxynitridation. A combination of a silicon (Si)-containing gas (e.g., monosilane ($SiH_4$) gas or disilane ($Si_2H_6$) gas), and an oxygen-containing gas or a nitrogen-containing gas may be used to form a film. Thus, reactive gases that are to be used may be appropriately selected according to the type of process. Accordingly, anisotropic/isotropic nitridation or oxynitridation, diffusion, film forming, or etching may be performed similar to anisotropic/isotropic oxidation as described above.

The scope of the present invention is as defined in the claims of the present application and includes supplementary notes described below.

[Supplementary Note 1]

According to an aspect of the present invention, there is provided a substrate processing apparatus including a process chamber; a coil installed along a peripheral portion of the process chamber; a substrate mounting table installed in the process chamber and configured to place a substrate having thereon grooves having a high aspect ratio; an electrode embedded in the substrate mounting table; a substrate transfer port installed on a wall of the process chamber; and a substrate mounting table elevator configured to move the substrate mounting table upward/downward to move a substrate placed on the substrate mounting table to a location between the substrate transfer port and a lower end of the coil.

[Supplementary Note 2]

In the substrate processing apparatus according to supplementary note 1, a varying mechanism configured to vary an impedance is connected to the electrode embedded in the substrate mounting table.

[Supplementary Note 3]

According to another aspect of the present invention, there is provided a method of manufacturing a semiconductor device, the method including: placing a substrate including grooves having a high aspect ratio on a substrate mounting table installed in a substrate processing chamber via a substrate transfer port; moving the substrate mounting table upward such that the substrate is located at a predetermined position below a lower end of a coil installed along a peripheral portion of the substrate processing chamber; supplying a predetermined gas into the substrate processing chamber; supplying power to the coil, transforming the gas into a plasma state, and processing the substrate using the gas; and unloading the substrate from the substrate processing chamber when the processing of the substrate is completed.

[Supplementary Note 4]

According to another aspect of the present invention, there is provided a substrate processing apparatus including a substrate processing chamber including a plasma generation space where a plasma is generated and a substrate processing space where a substrate is placed during a substrate process, the substrate processing space communicating with the plasma generation space; an inductive coupling structure disposed outside the plasma generation space wherein a sum of electrical lengths of a coil of the inductive coupling structure and a waveform adjustment circuit connected to the coil is an integer multiple of a wavelength of an applied power; a substrate mounting table disposed in the substrate processing space and supporting the substrate including grooves having high aspect ratios with a silicon-containing layer being disposed thereon; a substrate transfer port disposed at a wall of the substrate processing chamber; a substrate mounting table elevator configured to move the substrate mounting table upward/downward to move a substrate placed on the substrate mounting table to a location between the substrate transfer port and a lower end of the coil; a gas supply unit including an oxygen gas supply system configured to supply an oxygen-containing gas into the plasma generation space; and an exhaust unit configured to exhaust a gas from the substrate processing chamber.

[Supplementary Note 5]

In the substrate processing apparatus according to supplementary note 4, the gas supply unit further includes a hydrogen-containing gas supply system for supplying a hydrogen-containing gas.

[Supplementary Note 6]

According to another aspect of the present invention, there is provided a method of manufacturing a semiconductor device, including: placing a substrate on a substrate mounting table disposed in a substrate processing chamber via a substrate transfer port, the substrate including grooves having high aspect ratios with a silicon-containing layer being disposed thereon; exhausting a gas while supplying an oxygen-containing gas into a plasma generation space at an upper portion of the substrate processing chamber, the plasma generation space communicating with a space; generating a plasma in the plasma generation space by applying an electric power to a coil of an inductive coupling structure disposed at a peripheral portion of the plasma generation space, the electric power having a wavelength equal to an integer multiple of a sum of electrical lengths of the coil and a waveform adjustment circuit connected to the coil such that a generated plasma potential is lower than or equal to an electric potential of the substrate; and oxidizing the substrate in the substrate processing chamber using the plasma.

[Supplementary Note 7]

In the method according to supplementary note 6, a metal-containing layer is further formed in the grooves in addition to the silicon-containing layer, and a hydrogen-containing gas is supplied before the oxygen-containing gas is supplied.

[Supplementary Note 8]

In the method according to supplementary note 6, the metal-containing layer is heated to a temperature whereat the metal-containing layer is not reformed during the process of generating the plasma.

[Supplementary Note 9]

In the method according to supplementary note 6, the grooves are formed parallel to one another, a device structure including a metal-containing layer and the silicon-containing layer is formed between the grooves, and the silicon-containing layer is oxidized while the metal-containing layer is heated to a temperature whereat the metal-containing layer is not reformed in the process of generating the plasma.

DESCRIPTION OF REFERENCE NUMERALS

100: substrate processing apparatus
200: wafer
201: process chamber
212: resonance coil
217: susceptor
301: trench
302: mask layer

The invention claimed is:

1. A method of manufacturing a semiconductor device, comprising:

placing a substrate on a substrate mounting table disposed in a substrate processing chamber via a substrate transfer port, the substrate including grooves having high aspect ratios with a silicon-containing layer being disposed thereon;

exhausting a gas while supplying an oxygen gas into a plasma generation space at an upper portion of the substrate processing chamber, the plasma generation space communicating with a space;

generating a plasma in the plasma generation space by applying an electric power to a resonance coil of an inductive coupling structure disposed in a helix shape around the plasma generation space to generate an induced electric field for a plasma excitation of the oxygen gas, the electric power having a wavelength equal to an integer multiple of a sum of electrical lengths of the resonance coil and a waveform adjustment circuit connected to the resonance coil; and oxidizing the silicon-containing layer disposed on the grooves having high aspect ratios using the plasma, wherein inner walls of the grooves are oxidized during the oxidizing, such that thicknesses of oxide films formed on bottom portions and side portions of the grooves are uniform.

2. The method of claim 1, wherein the substrate further includes a metal-containing layer in addition to the silicon-containing layer, and a hydrogen gas is supplied when the oxygen gas is supplied.

3. The method of claim 2, wherein the grooves are arranged in parallel to one another, a device structure including the metal-containing layer and the silicon-containing layer is disposed between the grooves, and the hydrogen gas and the oxygen gas are in a plasma state during the oxidizing.

4. The method of claim 2, wherein the hydrogen gas is supplied prior to the oxygen gas.

5. The method of claim 1, wherein oxygen radicals and ions generated from the oxygen gas by the plasma excitation thereof are supplied into the grooves to modify the silicon-containing layer into a silicon oxide film during the oxidizing.

6. The method of claim 1, wherein the plasma is generated at a location having a height corresponding to an electrical central point on the resonance coil by the electric power applied to the resonance coil to generate the induced electric field in the substrate processing chamber in the generating of the plasma, and plasma-excited oxygen gas is dissociated into reactive species and the silicon-containing layer disposed on surfaces of the grooves is modified into a silicon oxide film by the reactive species.

7. The method of claim 1, further comprising moving the substrate to a location between the substrate transfer port and a lower end of the resonance coil after the placing of the substrate on the substrate mounting table.

\* \* \* \* \*